(12) United States Patent
Hoenigschmid

(10) Patent No.: US 6,426,907 B1
(45) Date of Patent: Jul. 30, 2002

(54) REFERENCE FOR MRAM CELL

(75) Inventor: Heinz Hoenigschmid, Fishkill, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/836,817

(22) Filed: Apr. 17, 2001

Related U.S. Application Data

(60) Provisional application No. 60/263,910, filed on Jan. 24, 2001.

(51) Int. Cl.$^7$ ................................. G11C 7/00
(52) U.S. Cl. .................... 365/210; 365/158; 365/189.07
(58) Field of Search ............................ 365/210, 189.01, 365/230.01, 97, 158, 189.07

(56) References Cited

U.S. PATENT DOCUMENTS

| | | |
|---|---|---|
| 6,055,178 A | 4/2000 | Naji |
| 6,111,781 A | 8/2000 | Naji |
| 6,128,239 A | 10/2000 | Perner |
| 6,185,143 B1 | 2/2001 | Perner et al. |
| 6,188,615 B1 * | 2/2001 | Perner et al. .......... 365/189.01 |
| 6,269,040 B1 | 7/2001 | Reohr et al. |

OTHER PUBLICATIONS

Peter K. Naji, et al., A 256kb 3.0V 1T1MTJ Nonvolatile Magnetoresistive RAM, ISSCC 2001/Feb. 6, 2001.

* cited by examiner

*Primary Examiner*—Son T. Dinh
(74) *Attorney, Agent, or Firm*—Slater & Matsil, L.L.P.

(57) ABSTRACT

A reference circuit (132) for an MRAM array, including logic "1" reference MRAM cells ($MR_{1a}$) and ($MR_{1b}$) coupled in parallel with logic "0" reference MRAM cells ($MR_{0a}$) and ($MR_{0b}$) The reference current ($I_{ref}$) is coupled to a measurement resistor ($R_{m4}$) of a sense amplifier (130) which is adapted to determine the logic state of an unknown memory cell $MC_u$.

26 Claims, 3 Drawing Sheets

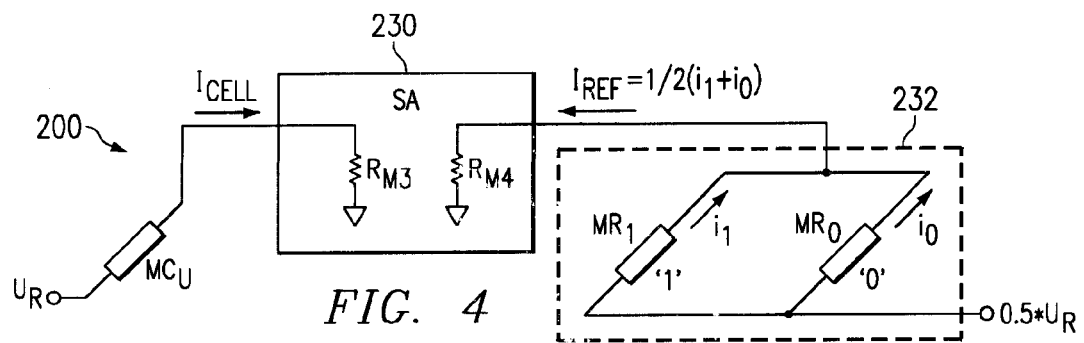
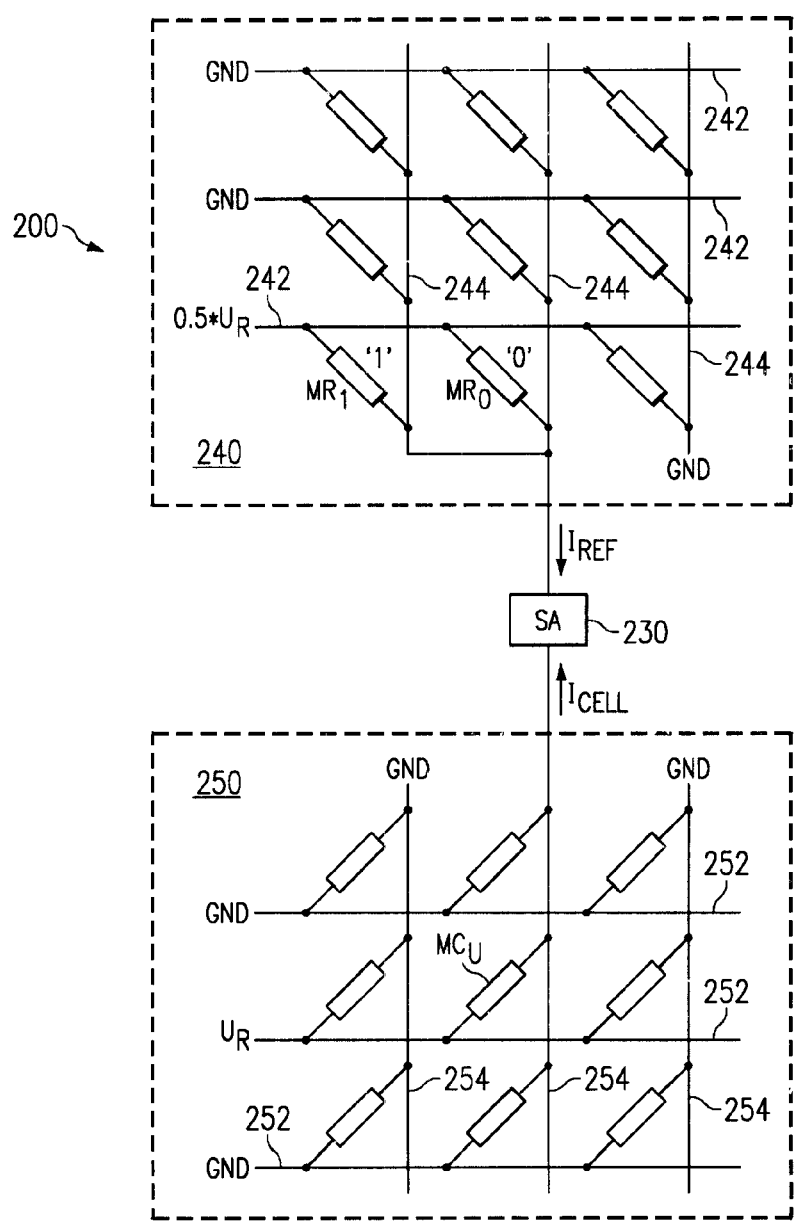
FIG. 5

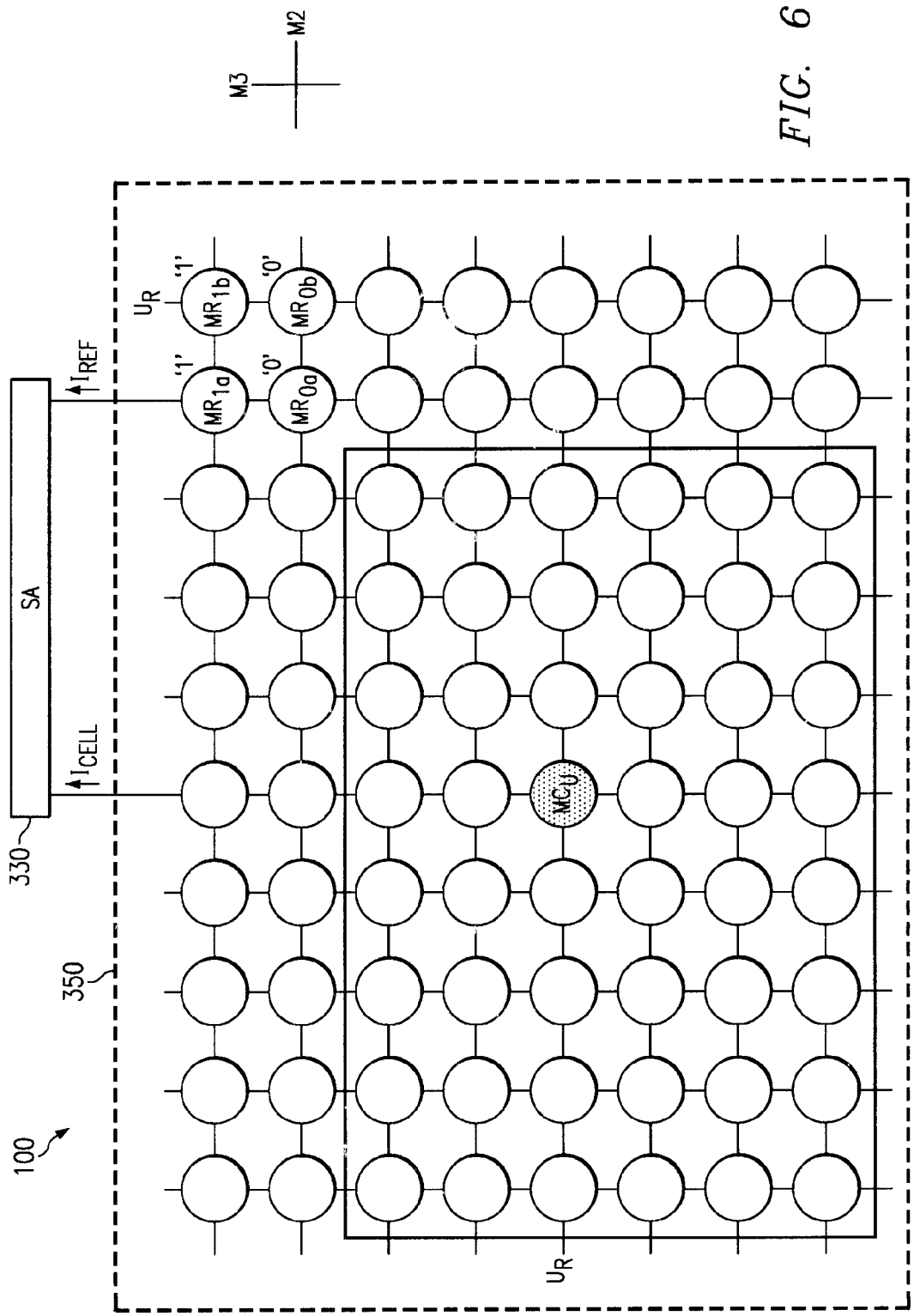

REFERENCE FOR MRAM CELL

This patent claims the benefit of U.S. Provisional Patent Application Ser. No. 60/263,910, filed Jan. 24, 2001, which is incorporated herein by reference.

TECHNICAL FIELD

The present invention relates generally to the fabrication of semiconductor devices, and more particularly to magnetic random access memory (MRAM) devices.

BACKGROUND OF THE INVENTION

Semiconductors are used for integrated circuits for electronic applications, including radios, televisions, cell phones, and personal computing devices, as examples. One type of semiconductor device is a semiconductor storage device, such as a dynamic random access memory (DRAM) and flash memory, which use an electron charge to store information.

A more recent development in memory integrated circuit devices involves spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is stored in the alignment of magnetic moments. The resistance of the magnetic component depends on the moment's alignment. The stored state is read from the element by detecting the component's resistive state. A memory cell may be constructed by placing the conductive lines and cross-points in a matrix structure or array having rows and columns.

An advantage of MRAMs compared to traditional semiconductor memory devices such as DRAMs is that MRAMs provide a non-volatile memory. For example, a personal computer (PC) utilizing MRAMs would not have a long "boot-up" time as with conventional PCs that utilize DRAMs. Also, an MRAM has the capability of remembering the stored data.

In order to read an MRAM storage cell, it is necessary to have a reference circuit so that the stored information can be sensed. In prior art MRAM cells, the reference circuit is located in a remote circuit, away from the MRAM array area, made of materials different from the MRAM storage cells, such as N-type field effect transistors (N-FET's) and P-FET's, as examples. This is disadvantageous because process flow materials and methods change differently for different devices during the process flow. These variables introduce fluctuations that can deleteriously impact the reference current generated, resulting in the incorrect reading of logic states of the MRAM memory cells.

What is needed in the art is an MRAM reference circuit design capable of accurately reading the logic state of MRAM storage cells.

SUMMARY OF THE INVENTION

The present invention achieves technical advantages as a reference circuit and method thereof for an MRAM device, having logic "1" and logic "0" MRAM storage cells coupled in parallel and being adapted to supply a reference current for a sensing amplifier of an MRAM array to determine the logic state of MRAM cells in the MRAM array.

Disclosed is a reference circuit for an MRAM array, comprising at least one MRAM storage cell having a logic "1" stored therein, and at least one MRAM storage cell having a logic "0" stored therein coupled to the logic "1" MRAM storage cell, wherein the reference circuit is adapted to supply a reference current for a sensing amplifier of the MRAM array to determine the logic state of MRAM cells in the array.

Further disclosed is a reference circuit for an MRAM array, comprising a first logic "1" storage cell having a first end and a second end, a second logic "1" storage cell having a first end and a second end coupled in series at the first end to the second end of the first logic "1" storage cell, a first logic "0" storage cell having a first end and a second end coupled at the first end to the first logic "1" storage cell first end, and a second logic "0" storage cell having a first end and a second end coupled in series at the first end to the second end of the first logic "0" storage cell, the second logic "0" storage cell second end being coupled to the second logic "1" storage cell second end, wherein the reference circuit is adapted to supply a reference current for a sensing amplifier of the MRAM array to determine the logic state of MRAM cells in the array.

Also disclosed a method of generating a reference current for a sensing amplifier of an MRAM device, the MRAM device comprising a plurality of storage cells arranged in an array, each storage cell comprising a logic state, comprising supplying a reference current, wherein the reference current comprises half of the current through at least one logic "1" MRAM storage cell and half the current through at least one logic "0", MRAM storage cell, wherein the logic state of an MRAM storage cell in the array is determinable by comparing the MRAM storage cell current and the reference current.

Advantages of the invention include providing a reference circuit having MRAM cells in the same type of array or same array as the MRAM cells to be read, so that the reference MRAM cells have been exposed to the same processing parameters and fluctuations as the MRAM cells being read. This is advantageous because the material and process related deviations and fluctuations are the same for the reference MRAM cells and the unknown MRAM cells being read, resulting in a more accurate reading of the unknown MRAM cells. Another advantage of the present invention is that half the current or midpoint between a logic "1" and a logic "0" memory cell is used as a reference current, resulting in the ability to accurately read whether the resistance of the MRAM storage cell is a logic "0" or a logic "1".

BRIEF DESCRIPTION OF THE DRAWINGS

The above features of the present invention will be more clearly understood from consideration of the following descriptions in connection with accompanying drawings in which:

FIG. 4 illustrates another embodiment of the reference circuit in accordance with the present invention;

FIG. 5 illustrates an embodiment of the present invention in which the reference circuit is located in an separate MRAM array; and FIG. 6 illustrates an implementation of the present invention wherein the reference circuit is located in the same MRAM array as the memory storage cells being read.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Prior art MRAM array reference circuits will be discussed, followed by a description of preferred embodiments and some advantages of the present invention.

Figure 1:
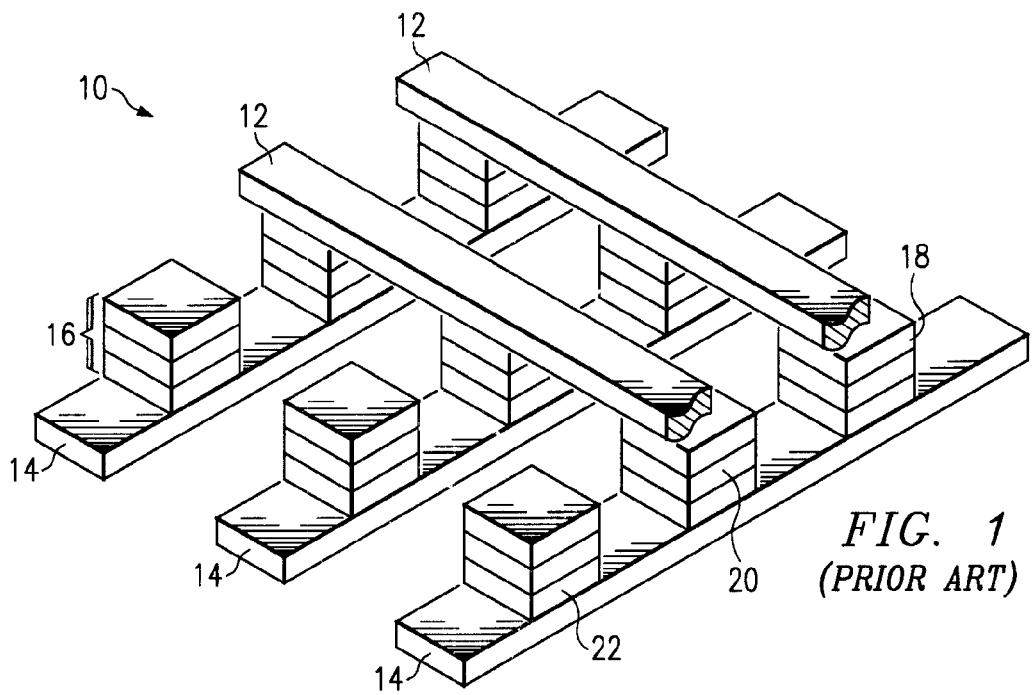
FIG. 1 shows a perspective view of an MRAM array having bitlines orthogonal to wordlines, sandwiching and electrically coupled to magnetic stacks that are adapted to store a logic "1" or "0"

FIG. 1 illustrates a perspective view of a prior art MRAM 10 having bitlines 12 located orthogonal to wordlines 14 in adjacent metallization layers. Magnetic stacks 16 are positioned between the bitlines 12 and wordlines 14 adjacent and electrically coupled to bitlines 12 and wordlines 14. Magnetic stacks 16 preferably comprise multiple layers, including a soft layer 18, a tunnel layer 20, and a hard layer 22, for example. Soft layer 18 and hard layer 22 preferably comprise a plurality of magnetic metal layers, for example, eight to twelve layers of materials such as PtMn, CoFe, Ru, and NiFe, as examples. Tunnel layer 20 comprises a dielectric such as $Al_2O_3$, for example. A logic state is storable in the soft layer 18 of the magnetic stacks 16 located at the junction of the bitlines 12 and wordlines 14 by running a current in the appropriate direction within the bitlines 12 and wordlines 14, which changes the resistance of the magnetic stacks 16.

Figure 2:
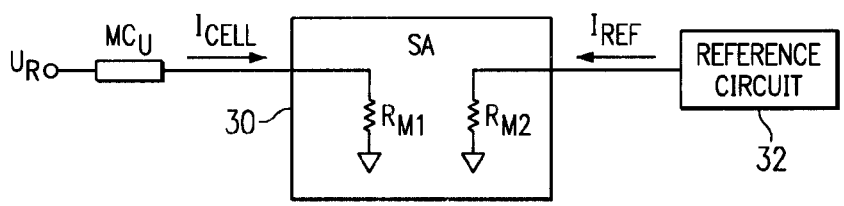
FIG. 2 illustrates an example of a prior art schematic for reading an MRAM storage cell in an array, including a sense amplifier and a reference current circuit.

In order to read the logic state stored in the soft layer 18 of the magnetic stack 16, a schematic such as the one shown in FIG. 2, including a sense amplifier (SA) 30, is used to determine the logic state stored in an unknown memory cell $MC_u$. A reference voltage $U_R$ is applied to one end of the unknown memory cell $MC_u$. The other end of the unknown memory cell $MC_u$ is coupled to a measurement resistor $R_{m1}$. The other end of the measurement resistor $R_{m1}$ is coupled to ground. The current running through the unknown memory cell $MC_u$ is equal to current $I_{cell}$. A reference circuit 32 supplies a reference current $I_{ref}$ that is run into measurement resistor $R_{m2}$. The other end of the measurement resistor $R_{m2}$ is coupled to ground, as shown.

The sense amplifier 30 comprising a comparator, for example, is adapted to compare currents $I_{cell}$ and $I_{ref}$ because measurement resistors $R_{m1}$ and $R_{m2}$ are equal. In this manner, the sense amplifier 30 can detect the logic state of the unknown memory cell $MC_u$. For example, a high ohmic state or "1" shows typically 20% higher resistance than the detected resistance of a memory cell $MC_u$ having a "0" or low ohmic state, e.g., 12 kΩ for an ohmic "1" state and 10 kΩ for an ohmic "0" state.

A problem with the circuit shown in the prior art drawing of FIG. 2 is that the reference current $I_{ref}$ is generated away from the MRAM bit cell array in a circuit or IC different from the memory array of the MRAM. This is undesirable, because fluctuations in the materials, processing and manufacturing of the memory array containing the unknown memory cell $MC_u$ may cause a need for a varied reference current $I_{ref}$. Reference generator 32 is always device dependent and temperature dependent, and usually does not have the same performance as an actual memory cell $MC_u$. Also, the memory cell $MC_u$ behaves differently than other circuits located away from the MRAM array.

The present invention achieves technical advantages by using MRAM cells for creating a reference current. This is advantageous because the reference MRAM cells are exposed to the same material and processing changes and fluctuations during manufacturing, and thus have a better match of various material and electrical properties as the MRAM cells $MC_u$ being read.

The MRAM memory cells described herein may also be referred to as magnetic stacks, or magnetic tunnel junction (MTJ) stacks.

Figure 3:
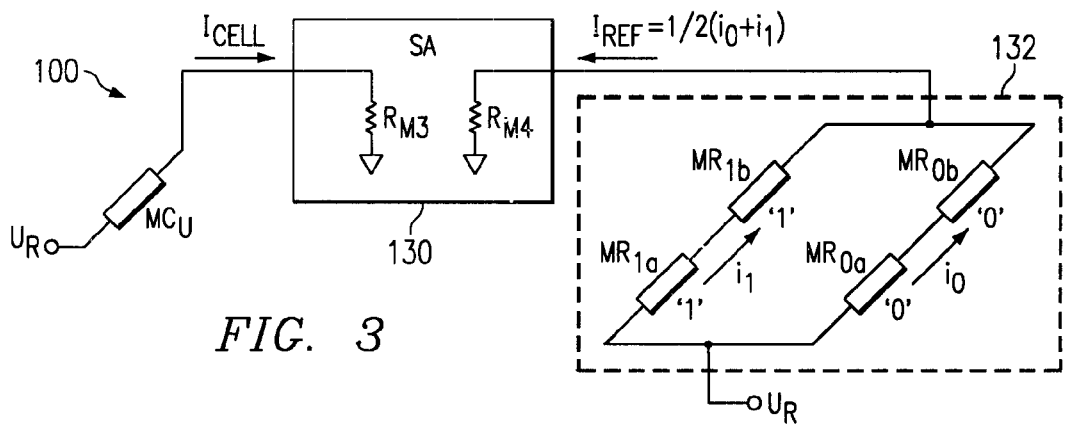
FIG. 3 shows a schematic of an embodiment of the reference circuit for an MRAM device in accordance with the present invention.

FIG. 3 illustrates a schematic 100 of a preferred embodiment of the present invention. A sense amplifier 130 comprises a first measurement resistor $R_{m3}$ and a second measurement resistor $R_{m4}$. Sense amplifier 130 preferably comprises a comparator, for example. One end of the first and second measurement resistors $RM_3$ and $RM_4$ is coupled to ground. The first measurement resistor $R_{m3}$ is coupled at the other end to an unknown memory cell $MC_u$. The unknown memory cell $MC_u$ comprises a memory cell within a MRAM array for which the logic state is desired to be read and determined. For example, a logic state was previously stored within memory cell $MC_u$ and now this logic state will be retrieved by the SA 130 utilizing the reference current $I_{ref}$ generated by the reference circuit 132. The unknown memory cell $MC_u$ is also coupled at the other end to a reference voltage $U_r$. Reference voltage $U_r$ preferably is 0.5 volts, although reference voltage $U_r$ may range from 0.1 to 5 volts, as examples. The current flowing through the unknown memory cell $MC_u$ is equal to current $I_{cell}$.

In accordance with a preferred embodiment, the reference circuit 132 that generates the reference current $I_{ref}$ comprises two MRAM memory cells $MR_{1a}/MR_{1b}$ having a logic "1" stored therein in series with two MRAM cells $MR_{0a}/MR_{0b}$ having a logic "0" stored therein, as shown. A first logic "1" MRAM cell $MR_{1a}$ is coupled in series with a second logic "1" MRAM cell $MR_{1b}$. A first logic "0" MRAM cell $MR_{0a}$ is coupled in series with a second logic "0" MRAM cell $MR_{0b}$. The series logic "1" MRAM cells $MR_{1a}/MR_{1b}$ are coupled in parallel with the series logic "0" MRAM cells $MR_{0a}/MR_{0b}$, and the parallel circuit 132 is coupled at one end to one end of the second measurement resistor $R_{m4}$ of the sense amplifier 130. The other end of the parallel circuit 132 is coupled to reference voltage $U_r$, the reference voltage $U_r$ being the same reference voltage $U_r$ on the MRAM array comprising the unknown memory cell $MC_u$ for which the logic state is being read. The reference circuit 132 generates a current $I_{ref}$ that is equal to:

$$I_{ref} = \tfrac{1}{2}(i_0 + i_1);$$

where $i_0$ is equal to the current that would flow through the series logic "0" MRAM cells $MR_{0a}$ and $MR_{0b}$ in the absence of MRAM cells $MR_{1a}$ and $MR_{1b}$, and the current $i_1$ is equal to the current that would flow through series logic "1" MRAM cells $MR_{1a}$ and $MR_{1b}$ in the absence of MRAM cells $MR_{0a}$ and $MR_{0b}$.

Another preferred embodiment of the present invention is shown in the schematic 200 of FIG. 4. In this embodiment, the second measurement resistor $R_{m4}$ of the sense amplifier 230 is coupled to one logic "1" MRAM cell MR$_1$ that is coupled in parallel with one logic "0" MRAM cell MR$_0$. The parallel reference circuit 232 created by the logic "1" MRAM cell MR$_1$ and the logic "0" MRAM cell MR$_0$ coupled in parallel is coupled at one end to the sense amplifier 230 second measurement resistor R$_{m4}$, and is coupled at the other end to a signal equivalent to 0.5 times the reference voltage U$_r$. Again, the reference current I$_{ref}$ is equal to:

$$I_{ref}=\frac{1}{2}(i_1+i_0);$$

where current i$_0$ is equal to the current that would flow through logic "0" MRAM cell MR$_0$ in the absence of MRAM cell MR$_1$, and current i$_1$ is equal to the current that would flow through logic "1" MRAM cell MR$_1$ in the absence of MRAM cell MR$_0$.

A parallel reference circuit 132/232 in accordance with the present invention including at least one logic "1" MRAM cell and at least one logic "0" MRAM cell coupled in parallel produces a reference current I$_{ref}$ that comprises the mid-point current between a logic "0" and a logic "1" MRAM cell. Depending on the logic state of the unknown memory element MC$_u$, a large or small amount of current I$_{cell}$ will flow through the unknown memory cell MC$_u$. In order to detect the correct stored information in the unknown memory element MC$_u$, the SA 130/230 compares the mid-point value I$_{ref}$ generated by the reference circuit 100/200 of the present invention to the current I$_{cell}$.

FIG. 5 illustrates the use of the schematic 200 in an implementation where the logic "1" and logic "0" MRAM cells MR$_1$ and MR$_0$ of the schematic in FIG. 4 are used to generate the reference current I$_{ref}$ for sense amplifier 230 in an MRAM array 240 that is away from the MRAM array 250 containing the unknown memory cell MC$_u$. The MRAM array 250 includes wordlines 252 and bitlines 254 that are used to address each of the memory cells in the array including the unknown memory cell MC$_u$. Similarly, the MRAM array 240 that includes the reference MRAM cells MR$_1$ and MR$_0$ in accordance with the present invention also includes wordlines 242 and bitlines 244 for addressing the various MRAM storage cells of the MRAM array 240 used for generating the reference current I$_{ref}$. Because the reference current I$_{ref}$ is generated by two MRAM cells MR$_1$ and MR$_0$ that have the same materials and manufacturing process exposure as the unknown memory cell MC$_u$ in the MRAM array 250, a more accurate reading of the resistive state of the unknown memory cell MC$_u$ may be attained, therefore resulting in a more accurate determination of the logic state of the unknown memory cell MC$_u$. Sense amplifier 230 compares currents I$_{cell}$ and I$_{ref}$ to determine the logic state of the unknown memory cell MC$_u$.

FIG. 6 illustrates an implementation of the reference circuit 100 shown in FIG. 3, where the reference MRAM cells MR$_{1a}$, MR$_{1b}$, MR$_{0a}$, and MR$_{0b}$ reside on the same MRAM array 350 as the unknown memory cell MC$_u$ for which the resistive/logic state is being read and determined. Each white circle in the array 100 represents an MRAM cell, and the shaded circle represents the unknown memory cell MC$_u$. The reference current I$_{ref}$ is generated by reference MRAM cells MR$_{1a}$, MR$_{1b}$, MR$_{0a}$, and MR$_{0b}$. The current I$_{cell}$ flows from unknown memory cell MC$_u$ to SA 330. The sense amplifier 330 is adapted to compare currents I$_{ref}$ and I$_{cell}$ to determine the logic state of MC$_u$. Because reference current I$_{ref}$ is generated by MRAM reference cells MR$_{1a}$, MR$_{1b}$, MR$_{0a}$, and MR$_{0b}$ on the same integrated circuit or MRAM array 350 as the unknown memory cell MC$_u$, a more accurate determination of the unknown memory cell MC$_u$ logic state can be made by the sense amplifier 330, in accordance with the present invention.

In order to write to the reference cells MR$_{1a}$, MR$_{1b}$, MR$_{0a}$, and MR$_{0b}$ in FIG. 6, conductive lines below and above the reference cells MR$_{1a}$, MR$_{1b}$, MR$_{0a}$, and MR$_{0b}$ are used, e.g. wordlines and bitlines in M1 and M4 metallization layers, for example.

Although FIG. 5 illustrates an implementation of the reference circuit 200 shown in FIG. 4 in a different MRAM array 240, similarly, the reference circuit 200 shown in FIG. 4 may be implemented within the same MRAM array 350 as the unknown memory cell MC$_u$ for which the logic state is being determined, not shown. Likewise, the reference circuit 100 shown in FIG. 3 may be implemented in an MRAM array 240 away from the MRAM array 250 containing the unknown memory cell MC$_u$, as shown in FIG. 5.

The present invention achieves technical advantages as a reference circuit 132/232 comprising MRAM cells MR$_0$, MR$_1$, MR$_{0a}$, MR$_{0b}$, MR$_{1a}$, and MR$_{1b}$ that are located either on the memory array being read, or on a different memory array. Because the reference current I$_{ref}$ in the present invention is generated by MRAM cells MR$_1$, MR$_0$, MR$_{1a}$, MR$_{1b}$, MR$_{0a}$, and MR$_{0b}$, the resistances of the reference circuits 132 and 232 are matched more closely to the resistance of unknown MRAM cell MC$_u$, resulting in a more accurate reading of the logic state of the unknown memory cell MC$_u$. Any material or process fluctuations or deviations are shared by the MRAM array unknown memory cell MC$_u$ and the MRAM reference cells used in the parallel circuits 132 and 232 used to generate the reference current I$_{ref}$. Using a reference current I$_{ref}$ that comprises the midpoint current between a logic "0" and a logic "1" MRAM cell provides a more accurate reading of unknown memory cells MC$_u$.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A reference circuit for a magnetic random access memory (MRAM) array, comprising:
   exactly one MRAM storage cell having a logic "1" stored therein; and
   exactly one MRAM storage cell having a logic "0" stored therein coupled to the logic "1" MRAM storage cell, wherein the logic "1" and logic "0" MRAM storage cells are coupled together in parallel, wherein one end of the parallel storage cells is coupleable to a reference voltage, and wherein the other end of the parallel storage cells comprises a reference current node coupleable to a sensing amplifier of the MRAM array.

2. The reference circuit according to claim 1, wherein a current through the logic "1" MRAM storage cell in the absence of the logic "0" MRAM storage cell is equal to $i_1$, a current through the logic "0" MRAM storage cell in the absence of the logic "1" MRAM storage cell is equal to $i_0$, and the reference current is approximately equal to $\frac{1}{2}(i_1+i_0)$.

3. The reference circuit according to claim 1, wherein the reference circuit storage cells are part of the MRAM array.

4. The reference circuit according to claim 1, wherein the reference circuit storage cells are part of an MRAM array different from the MRAM array for which the reference current is being generated.

5. A reference circuit for a magnetic random access memory (MRAM) array, comprising:

a first logic "1"storage cell having a first end and a second end;

a second logic "1" storage cell having a first end and a second end, the second logic "1" storage cell being coupled in series at the first end to the second end of the first logic "1" storage cell;

a first logic "0" storage cell having a first end and a second end, the first logic "0" storage cell being coupled at the first end to the first logic "1" storage cell first end; and a second logic "0" storage cell having a first end and a second end, the second logic "0" storage cell being coupled in series at the first end to the second end of the first logic "0" storage cell, the second logic "0" storage cell second end being coupled to the second logic "1" storage cell second end, wherein the reference circuit is adapted to supply a reference current for a sensing amplifier of the MRAM array to determine the logic state of MRAM cells in the array.

6. The reference circuit according to claim 5, wherein a current through the first and second logic "1" MRAM storage cells in the absence of the first and second logic "0" MRAM storage cells is equal to $i_1$, a current through the first and second logic "0" MRAM storage cells in the absence of the first and second logic "1" MRAM storage cells is equal to $i_0$, and the reference current is approximately equal to $\frac{1}{2}(i_1+i_0)$.

7. The reference circuit according to claim 6, wherein the second logic "1" MRAM storage cell second end and the second logic "0" MRAM storage cell second end-are coupled to a reference voltage equal to the reference voltage for the MRAM array, and wherein the first logic "1" MRAM storage cell first end and the first logic "0" MRAM storage cell first end are coupleable to the MRAM array sensing amplifier.

8. The reference circuit according to claim 7, wherein the reference circuit storage cells are part of the MRAM array.

9. The reference circuit according to claim 7, wherein the reference circuit storage cells are part of an MRAM array different from the MRAM array for which the reference current is being generated.

10. A method of generating a reference current for a sensing amplifier of a magnetic random access memory (MRAM) device, the MRAM device comprising a plurality of storage cells arranged in an array, each storage cell comprising a logic state, the method comprising supplying a reference current, wherein supplying a reference current comprises:

coupling a first end of exactly one MRAM storage cell having a logic "1" stored therein to the sensing amplifier;

coupling a first end of exactly one MRAM storage cell having a logic "0" stored therein to the logic "1" MRAM storage cell first end and the sensing amplifier; and coupling a second end of the logic "1" MRAM storage cell and a second end of the logic "0" MRAM storage cell to a reference voltage, wherein the logic state of an MRAM storage cell in the array is determinable by comparing the MRAM storage cell current and the reference current.

11. The method according to claim 10, wherein the reference current comprises half of the current through at least one logic "1" MR storage cell and half the current through at least one logic "0" MRAM storage cell.

12. The method according to claim 10, wherein the reference voltage is equal to half a reference voltage for the MRAM array.

13. The method according to claim 10, wherein the reference circuit storage cells are part of the MRAM array.

14. The method according to claim 10, wherein the reference circuit storage cells are part of an MRAM array different from the MRAM array for which the reference current is being generated.

15. A method of generating a reference current for a sensing amplifier of a magnetic random access memory (MRAM) device, the MRAM device comprising a plurality of storage cells arranged in an array, each storage cell comprising a logic state, the method comprising supplying a reference current, wherein supplying a reference current comprises:

providing a first logic "1" storage cell having a first end and a second end;

coupling a second logic "1" storage cell having a first end and a second end at the first end to the second end of the first logic "1" storage cell;

coupling a first logic "0" storage cell having a first end and a second end at the first end to the first logic "1" storage cell first end and to a reference voltage of the MRAM array;

coupling a second logic "0" storage cell having a first end and a second end in series at the first end to the second end of the first logic "0" storage cell; and coupling the second logic "0" storage cell second end to the second logic "1" storage cell second end, wherein the logic state of an MRAM storage cell in the array is determinable by comparing the MRAM storage cell current and the reference current.

16. The method according to claim 15, wherein the reference circuit storage cells are part of the MRAM array.

17. The method according to claim 15, wherein the reference circuit storage cells are part of an MRAM array different from the MRAM array for which the reference current is being generated.

18. A reference circuit for a magnetic random access memory (MRAM) array, comprising:

two MRAM storage cells having a logic "1" stored therein coupled together in series; and two MRAM storage cells having a logic "0" stored therein coupled together in series, the two series logic "0" storage cells being coupled in parallel to the two logic "1" storage cells, wherein one end of the parallel storage cells is coupled to a reference voltage equal to a reference voltage for the MRAM array, and wherein the other end of the parallel storage cells comprises a reference current node coupleable to a sensing amplifier of the MRAM array.

19. The reference circuit according to claim 18, wherein the reference circuit storage cells are part of the MRAM array.

20. The reference circuit according to claim 18, wherein the reference circuit storage cells are part of an MRAM array different from the MRAM array for which the reference current is being generated.

21. The method according to claim 15, wherein the reference voltage is equal to half a reference voltage for the MRAM array.

22. The reference circuit according to claim 1, wherein the reference voltage is equal to half a reference voltage for the MRAM array.

23. The reference circuit according to claim 1, wherein the reference voltage comprises 0.1 to 5 volts.

24. The method according to claim 10, wherein coupling a second end of the logic "1" MRAM storage cell and a second end of the logic "0" MRAM storage cell to a reference voltage comprises coupling the second end of the logic "1" MRAM storage cell and the second end of the logic "0" MRAM storage cell to a reference voltage comprising 0.1 to 5 volts.

25. The method according to claim 15, wherein coupling the first logic "0" storage cell first end to a reference voltage comprises coupling the first logic "0" storage cell first end to a reference voltage comprising 0.1 to 5 volts.

26. The reference circuit according to claim 18, wherein the reference voltage comprises 0.1 to 5 volts.

\* \* \* \* \*

UNITED STATES PATENT AND TRADEMARK OFFICE
CERTIFICATE OF CORRECTION

PATENT NO. : 6,426,907 B1
DATED : July 30, 2002
INVENTOR(S) : Hoenigschmid

It is certified that error appears in the above-identified patent and that said Letters Patent is hereby corrected as shown below:

Column 8,
Line 8, replace "MR" with -- MRAM --.

Signed and Sealed this

Twenty-fifth Day of March, 2003

JAMES E. ROGAN
*Director of the United States Patent and Trademark Office*